United States Patent [19]

Steinmann et al.

[11] Patent Number: 5,476,749
[45] Date of Patent: Dec. 19, 1995

[54] PHOTOSENSITIVE COMPOSITIONS BASED ON ACRYLATES

[75] Inventors: Bettina Steinmann, Praroman; Rolf Wiesendanger, Basel; Adrian Schulthess, Tentlingen; Max Hunziker, Düdingen, all of Switzerland

[73] Assignee: Ciba-Geigy Corporation, Tarrytown, N.Y.

[21] Appl. No.: 303,563

[22] Filed: Sep. 9, 1994

Related U.S. Application Data

[63] Continuation of Ser. No. 857,525, Mar. 25, 1992, abandoned.

[30] Foreign Application Priority Data

Mar. 27, 1991 [CH] Switzerland .................... 936/91
Jan. 23, 1992 [CH] Switzerland .................... 199/92

[51] Int. Cl.$^6$ .................................................. G03C 5/00
[52] U.S. Cl. ....................... 430/269; 430/15; 430/280; 522/92
[58] Field of Search ......................... 430/280, 269, 430/15; 522/92

[56] References Cited

U.S. PATENT DOCUMENTS

| | | | |
|---|---|---|---|
| 4,100,141 | 7/1978 | O'Sullivan | 526/301 |
| 4,575,330 | 3/1986 | Hull | 425/174.4 |
| 4,789,620 | 12/1988 | Sasaki | 522/103 |

FOREIGN PATENT DOCUMENTS

| | | |
|---|---|---|
| 0286594 | 10/1988 | European Pat. Off. . |
| 0378144 | 7/1990 | European Pat. Off. . |
| 0425441 | 5/1991 | European Pat. Off. . |

OTHER PUBLICATIONS

Derwent Abstract 88–287732/41 of EP 286, 594–A (Oct. 12, 1988).
Chem Abstract 111(14): 123819s.
Rev. Sci. Instrum. 52(11), Nov. 1981 pp. 1770–1773.
Derwent Abst. 91–126890/18 (1991).
WPI Acc. No: 91–126891/18.

*Primary Examiner*—Mark A. Chapman
*Attorney, Agent, or Firm*—William A. Teoli, Jr.

[57] ABSTRACT

A liquid photosensitive composition comprising (1) 40 to 80% by weight of a urethane (meth)acrylate having a functionality of 2 to 4 and a molecular weight (Mw) of 500 to 10,000, (2) 5 to 40% by weight of a hydroxyl group containing aliphatic or cycloaliphatic di(meth)acrylate, (3) 0 to 40% by weight of a mono(meth)acrylate or of a mono-N-vinyl compound having a Mw of not more than 500, (4) 0.1 to 10% by weight of a photoinitiator, (5) 0 to 30% by weight of an aliphatic or cycloaliphatic di(meth)acrylate which differs from (2), of an aliphatic tri(meth)acrylate or of an aromatic di- or tri(meth)acrylate, and (6) 0 to 5% by weight of customary additives, such that the proportion of components (1) to (6) together is 100% by weight.

The composition is a photosensitive composition which can be polymerised by irradiation with actinic light and which is suitable for the production preferably of three-dimensional objects by the stereolithographic technique.

15 Claims, No Drawings

PHOTOSENSITIVE COMPOSITIONS BASED ON ACRYLATES

This application is a continuation of application Ser. No. 07/857,525, filed Mar. 25, 1992, now abandoned.

The present invention relates to a liquid photosensitive composition, to a process for polymerising said composition by radiation with actinic light, to a process for the production of three-dimensional objects from said liquid composition and to the use of this composition for forming photopolymerisable layers, especially three-dimensional objects fabricated from a plurality of photopolymerisable layers.

It is known that radiation-sensitive liquid resins or resin compositions have versatile utilities, typically as coating compositions, adhesives or photoresists. In principle, liquid resins or resin systems should quite generally also be suitable for forming three-dimensional objects by the stereolithographic technique disclosed in U.S. Pat. No. 4,575,330. However, ninny resins prove to be too viscous, whereas others are too insufficiently light-sensitive or, during the cure, suffer too severe shrinkage. The strength properties of the moulded articles or objects fabricated from photocured resins are also often unsatisfactory.

That complicated three-dimensional objects can be formed from liquid light-sensitive resins by the stereolithographic technique is well-known. Such objects are formed from layers by bonding each new curable resin layer tenaciously to the previously prehardened layer by curing with UV/VIS light. It is common knowledge that the total assembly of the three-dimensional object can be accomplished by means of a computer-controlled process.

In recent years there has been no lack of efforts to develop resin systems suitable for the technique of stereolithography. In Rev. Sci. Instrum. 52 (11) 1170–1173 (1981), It. Kodama discloses under the registered trademark "Tevista" a liquid photohardening resin composition comprising an unsaturated polyester, acrylate, styrene, a polymerisation initiator and a sensitiser. The drawback of this resin system for use in stereolithography is that the photosensitivity is insufficient and the so-called "green strength" of the objects hardened by laser beams is rather low.

The technique of stereolithography is described in detail in U.S. Pat. No. 4,575,330. The liquid resin used is a modified acrylate which is referred to in the description as "Potting Compound 363". Such resin compositions are disclosed in U.S. Pat. No. 4,100,141. They too have the drawback of being insufficiently light-sensitive and of requiring lengthy times for the fabrication of three-dimensional objects by the stereolithographic technique.

It is therefore understandable that the demands made of resins for use in stereolithography are high. For example, they must have a viscosity suitable for processing in the intended apparatus. The photosensitivity of the resin system must be such that the ratio of the radiation energy applied and the depth of penetration into the liquid photosensitive resin composition so as to effect solidification of the parts is within reasonable limits. This means that, when using a resin suitable for use in stereolithography, the aim shall be to achieve the greatest possible curing depth with little radiation energy, simultaneously coupled with a high degree of polymerisation and high green strength.

In the technique employed in stereolithography of successively polymerising thin layers, none of the layers is fully cured. The partially cured object is called a green object, and the module of elasticity and the tensile strength of this green object is called the green strength. Normally the green object is cured with UV/VIS light, conveniently with a mercury or xenon arc lamp. The green strength of an object is therefore an important parameter, as objects having a low green strength may become deformed under their own weight or, in the course of the cure, they may sag or collapse.

It has now been found that a liquid resin composition comprising several (meth)acrylates which differ from another, and which additionally comprises a hydroxyl group containing aliphatic or cycloaliphatic di(meth)acrylate, may be used for stereolithography and is able to form green objects when precured with laser beams, which objects have high green strength. The objects formed by curing the green objects have excellent flexibility and, in addition, are distinguished by excellent tear growth resistance.

Accordingly, the invention relates to a liquid photosensitive composition comprising (1) 40 to 80% by weight of a urethane (meth)acrylate having a functionality of 2 to 4 and a molecular weight (Mw) of 500 to 10 000, (2) 5 to 40% by weight of a hydroxyl group containing aliphatic or cycloaliphatic di(meth)acrylate, (3) 0 to 40% by weight of a mono(meth)acrylate or of a mono-N-vinyl compound having a Mw of not more than 500, (4) 0.1 to 10% by weight of a photoinitiator, (5) 0 to 30% by weight of an aliphatic or cycloaliphatic di(meth)acrylate which differs from (2), of an aliphatic tri(meth)acrylate or of an aromatic di- or tri(meth)acrylate, and (6) 0 to 5% by weight of customary additives, such that the proportion of components ( 1 ) to (6) together is 100% by weight.

Preferably the composition of this invention comprises (1) 40 to 80% by weight of a urethane (meth)acrylate having a functionality of 2 to 4 and a molecular weight (Mw) of 500 to 10 000, (2) 5 to 40% by weight of a hydroxyl group containing aliphatic or cycloaliphatic di(meth)acrylate, (3) 5 to 40% by weight of a mono(meth)acrylate or of a mono-N-vinyl compound having a Mw of not more than 500, (4) 0.1 to 10% by weight of a photoinitiator, (5) 0 to 30% by weight of an aliphatic or cycloaliphatic di(meth)acrylate which differs from (2), of an aliphatic tri(meth)acrylate or of an aromatic di- or tri(meth)acrylate, and (6) 0 to 5% by weight of customary additives.

More particularly the composition of the invention comprises (1) 50 to 70% by weight of a urethane (meth)acrylate having a functionality of 2 to 4 and a molecular weight (Mw) of 1000 to 10,000, (2) 10 to 30% by weight of a hydroxyl group containing aliphatic di(meth)acrylate, (3) 0 to 30% by weight of a mono(meth)acrylate or of a mono-N-vinyl compound having a Mw of not more than 500, (4) 0.5 to 7% by weight of a photoinitiator, (5) 0 to 20% by weight of an aliphatic or cycloaliphatic bis(meth)acrylate which differs from (2), of an aliphatic tris(meth)acrylate or of an aromatic di- or tris-(meth)acrylate, and (6) 0 to 3% by weight of an additive.

In the particularly preferred embodiment of the invention, component (3) comprises preferably 10 to 30% by weight of a mono(meth)acrylate or of a mono-N-vinyl compound having a Mw of not more than 500.

The urethane acrylates used as component (1) of the novel compositions are known to those skilled in the art and can be prepared in known manner, conveniently by reacting a hydroxyl-terminated polyurethane with acrylic acid or methacrylic acid to the corresponding urethane acrylate, or by reacting an isocyanate-terminated prepolymer with hydroxyalkyl acrylates or methacrylates to the urethane acrylate. Appropriate processes are disclosed in published EP patent applications 114 982 and 133 908. The molecular weight of such acrylates is usually in the range from 400 to 10,000, preferably from 500 to 7000.

Compounds useful as component (2) include reaction products of aliphatic epoxy resins, such as alkanediol diglycidyl ethers, including the diglycidyl ether of 1,4-butanediol, the diglycidyl ether of polyethylene glycol or polybutylene glycol, or cycloaliphatic epoxy resins, such as the diglycidyl esters of cycloaliphatic dicarboxylic acids, for example the diglycidyl ester of hexahydrophthalic acid, or hydrogenated diglycidyl ethers of bisphenols, typically the diglycidyl ether of hydrogenated bisphenol A, or epoxy resins having an epoxy group attached direct to the cycloaliphatic ring, such as bis-( 3,4-epoxycyclohexylmethyl) adipate, which cited compounds with (meth)acrylic acid may lead to reaction products of the following formulae

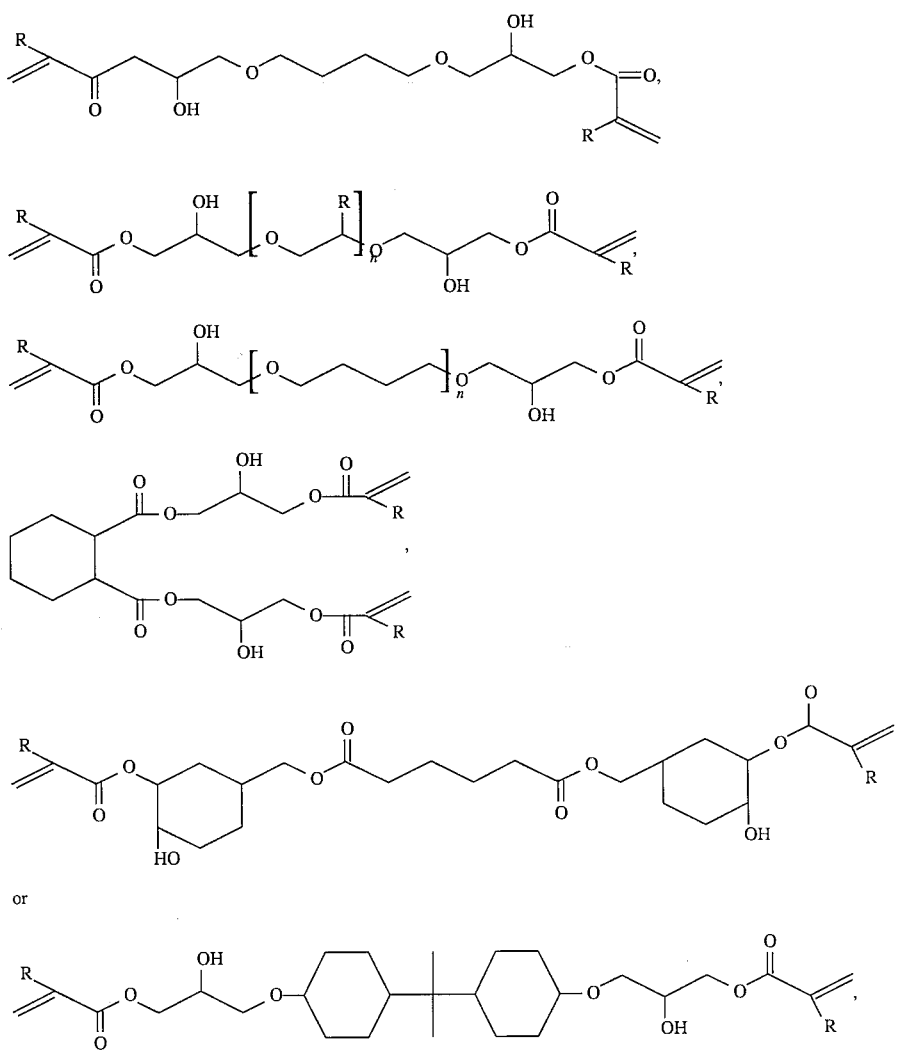

wherein R is a hydrogen atom or methyl and n is a number greater 1, and also reaction products of epoxidised fatty acid with (meth)acrylic acid, or caprolactone-modified reaction products of aliphatic or cycloaliphatic epoxy resins, for example the diglycidyl ether of 1,4-butanediol, with (meth)acrylic acid to give a product of formula Urethane acrylates are commercially available and are sold, inter alia, by UCB under the registered trademark EBECRYL®, by Morton Thiokol under the registered trademark Uvithane®, or by the SARTOMER Company under the product names SR 9504, SR 9600, SR 9610, SR 9620, SR 9630, SR 9640 and SR 9650.

It is preferred to use those urethane acrylates which have a Mw of 500–700 and which have preferably been prepared from aliphatic educts.

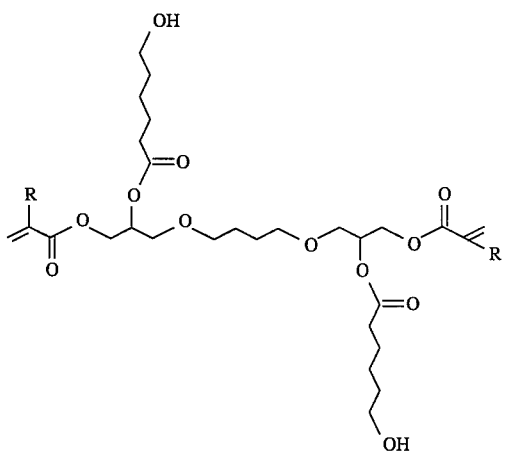

wherein R is a hydrogen atom or methyl. These reaction products of aliphatic or cycloaliphatic epoxy resins and (meth)acrylic acid are known, inter alia from JP Kokai 50-059487 or from Org. Coat. Plast. Chem. 40, pages 104–109, 1979, where processes for their preparation are also described.

The caprolactone-modified reaction product of aliphatic or cycloaliphatic resins and (meth)acrylic acid is also known and can be prepared by reacting 1 tool of a reaction product of the aliphatic or cycloaliphatic epoxy resin and (meth)acrylic acid with 2 mol of caprolactone in an organic solvent at elevated temperature and in the presence or absence of a catalyst.

Representative examples of further aliphatic or cycloaliphatic resins which may be used for preparing the above mentioned reaction products are: the diglycidyl and bis(β-methylglycidyl) esters of aliphatic dicarboxylic acids, including oxalic acid, succinic acid, glutaric acid, pimelic acid, suberic acid, azelaic acid, sebacic acid or dimerised linolic acid, the diglycidyl esters of cycloaliphatic dicarboxylic acids, including tetrahydrophthalic acid, 4-methyltetrahydrophthalic acid or 4-methylhexahydrophthalic acid, the diglycidyl ethers of higher aliphatic alcohols, such as 1,5-pentanediol, 1,6-hexanediol or 1,8-octanediol, the diglycidyl ethers of cycloaliphatic diols, such as resorcitol, quinitol, bis(4-hydroxycyclohexyl)methane, 2,2-bis(4-hydroxycyclohexyl)propane and 1,1-bis(hydroxymethyl)-3-cyclohexene.

The novel compositions preferably contain a reaction product of the diglycidyl ether of 1,4-butanediol and acrylic acid as hydroxyl group containing aliphatic diacrylate (2).

Component (2) of the novel compositions is preferably a hydroxyl group containing cycloaliphatic bis(meth)acrylate, more particularly a reaction product of the diglycidyl ester of hexahydrophthalic acid or bis(3,4-epoxycyclohexylmethyl)adipate and (meth)acrylic acid.

Component (3) of the novel compositions may be selected from the following compounds: allyl acrylate, allyl methacrylate, methyl (meth)acrylate, ethyl (meth)acrylate, n-propyl (meth)acrylate, n-butyl (meth)acrylate, isobutyl (meth)acrylate, n-hexyl (meth)acrylate, 2-ethylhexyl (meth)acrylate, n-octyl (meth)acrylate, n-decyl (meth)acrylate and n-dodecyl (meth)acrylate, 2-hydroxyethyl (meth)acrylate, 2- and 3-hydroxypropyl (meth)acrylate, 2-methoxyethyl (meth)acrylate, 2-ethoxyethyl (meth)acrylate and 2- or 3-ethoxypropyl (meth)acrylate, tetrahydrofurfuryl methacrylate, 2-(2-ethoxyethoxy)ethylacrylate, cyclohexyl methacrylate, 2-phenoxyethyl acrylate, glycidyl acrylate and isodecyl acrylate; and the mono-N-vinyl compound is N-vinylpyrrolidone or N-vinylcaprolactam. Such products are also known and some are commercially available, as from SARTOMER.

The compounds suitable for use as component (3) preferably have a Mw von 50–300.

Component (3) of the novel compositions is preferably a mono-N-vinyl compound, more particularly N-vinylpyrrolidone.

Any type of photoinitiator which, when irradiated suitably, forms free radicals can be employed as component (4) in the novel compositions. Typical known photoinitiators are benzoins, benzoin ethers, including benzoin, benzoin methyl ether, benzoin ethyl ether and benzoin isopropyl ether, benzoin phenyl ether and benzoin acetate, acetophenones, including acetophenone, 2,2-dimethoxyacetophenone and 1,1-dichloroacetophenone, benzil, benzil ketals, such as benzil dimethyl ketal and benzil diethyl ketal, anthraquinones, including 2-methylanthraquinone, 2-ethylanthraquinone, 2-tert-butylanthraquinone, 1-chloroanthraquinone and 2-amylanthraquinone, triphenylphosphine, benzoylphosphine oxides, for example 2,4,6-trimethylbenzoyldiphenylphosphine oxide (Luzirin TPO), benzophenones, such as benzophenone and 4,4'-bis(N,N'-dimethylamino)benzophenone, thioxanthones and xanthones, acridine derivatives, phenazine derivatives, quinoxaline derivatives or 1-phenyl-1,2-propanedione, 2-O-benzoyl oxime, 1-aminophenyl ketones or 1-hydroxyphenyl ketones, such as 1-hydroxycyclohexyl phenyl ketone, phenyl 1-hydroxyisopropyl ketone and 4-isopropylphenyl 1-hydroxyisopropyl ketone, all of which are known compounds.

Particularly suitable photoinitiators which are normally used in combination with a HeCd laser as radiation source am acetophenones, conveniently 2,2-dialkoxybenzophenones, and α-hydroxyphenyl ketones, for example 1-hydroxycyclohexyl phenyl ketone or 2-hydroxyisopropyl phenyl ketone (=2-hydroxy-2,2-dimethylacetophenone).

Another class of photoinitiators (4) which are normally employed when irradiating with argon ion lasers are the benzil ketals, typically benzil dimethyl ketal. Preferably the photoinitiator is an α-hydroxyphenyl ketone, benzil dimethyl ketal or 2,4,6-trimethylbenzoyldiphenylphosphine oxide or a mixture of these initiators.

Another class of suitable photoinitiators (4) comprises the ionic dye-counter ion compounds which are capable of absorbing actinic radiation and generating free radicals which initiate the polymerisation of the acrylates (1) to (3) and optionally (5). The compositions of the invention containing ionic dye-counter ion compounds can be cured more variably in this way with visible light within the adjustable wavelength range of 400–700 nm. Ionic dye-counter ion compounds and their mode of action are known, for example from EP-A-0 223 587 and U.S. Pat. Nos. 4,751,102; 4,772,530 and 4,772,541. Typical examples of suitable ionic dye-counter ion compounds are the anionic dye-iodonium ion complexes, the anionic dye-pyrylium ion complexes and, especially, the cationic dye-borate artion compounds of formula

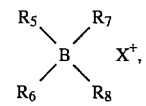

wherein $X^+$ is a cationic dye and $R_5$, $R_6$, $R_7$ and $R_8$ are each independently of one another an alkyl, aryl, alkaryl, allyl, aralkyl, alkenyl or alkinyl group, an alicyclic group or a saturated or unsaturated heterocyclic group.

It is common practice to add the photoinitiators in effective mounts, i.e. in amounts of c. 0.1 to 10% by weight, based on the total amount of the composition. If the novel compositions are used for stereolithographic methods in which laser beams are normally used, it is essential to adjust the absorption capacity of the mixtures by the type and concentration of the photoinitiator such that the depth of cure at normal laser speed is about 0.1 to 2.5 mm.

The novel compositions may also contain other photoinitiators of different sensitivity to radiation of emission lines of different wavelengths. The inclusion of such photoinitiators effects the better utilisation of a UV/VIS light source which radiates emission lines of different wavelength. It is advantageous to choose these other photoinitiators and to use them such that a uniform optical absorption is produced with respect to the emission lines used.

The photoinitiator (4) in the novel compositions is preferably a 1-hydroxyphenyl ketone, more particularly 1-hydroxycyclohexyl phenyl ketone.

The novel compositions may contain as component (5) further acrylates which differ from component (2).

Suitable aliphatic or cycloaliphatic di(meth)acrylates which differ from component (2) are typically the diacrylate and dimethacrylate esters of aliphatic or cycloaliphatic diols, including 1,3-butylene glycol, 1,4-butanediol, neopentyl glycol, 1,6-hexanediol, diethylene glycol, triethyleneglycol, tetraethylene glycol, polyethylene glycol 400, polyethylene glycol 600, tripropylene glycol, ethoxylated or propoxylated neopentyl glycol, 1,4-dimethylcyclohexane, 2,2-bis(4-hydroxycyclohexyl)propane or bis(4-hydroxycyclohexyl)methane.

Tri(meth)acrylates useful as component (5) are typically the non-hydroxylated triacrylate and trimethacrylate esters of 2,4,6-hexanetriol, glycerol or 1,1,1-trimethylolpropane, ethoxylated or propoxylated glycerol or 1,1,1-trimethylolpropane and the hydroxyl group containing tri(meth)acrylates which are obtained by reaction of triepoxy compounds such as the triglycidyl ethers of the cited triols with (meth)acrylic acid Aromatic bis- and tris(meth)acrylates useful as component (5) are typically the reaction products of his- or trisglycidyl ethers of dihydric or trihydric phenols, including resorcinol, hydroquinone, bis(4-hydroxyphenyl)methane, 4,4'-dihydroxydiphenyl, bis(4-hydroxyphenyl)sulfone, 1,1,2,2-tetrakis(4-hydroxyphenyl)ethane, 2,2-bis(4-hydroxyphenyl)propane, ethoxylated or propoxylated 2,2-bis(4-hydroxyphenyl)propane and 2,2-bis-( 3,5-dibromo-4-hydroxyphenyl)propane and trihydroxylated phenol or cresol novolaks with (meth)acrylic acid.

The acrylates useful as component (5) are also known compounds.

Preferably component (5) of the photosensitive compositions is a reaction product of a diglycidyl ether of a bisphenol and acrylic acid, more particularly of a diglycidyl ether of bisphenol A and acrylic acid.

If desired, customary additives can be added to the compositions of this invention, typically stabilisers such as UV stabilisers, polymerisation inhibitors, slip agents, wetting agents, flow control agents, sensitisers, antiprecipitants, surfactants, dyes, pigments or fillers.

The compositions can be prepared in known manner, conveniently by premixing individual components and subsequently blending these premixes, or by blending all components in conventional apparatus, such as stirred vessels, excluding light and at slightly elevated temperature.

The novel photosensitive compositions can be polymerised by irradiation with actinic light, typically with electron beams, X-rays, UV or VIS light, i.e. with radiation in the wavelength range from 280–650 nm. Particularly suitable light sources are HeCd, argon or nitrogen laser light as well as metal vapour and NdYAG lasers with multiple frequency. Those skilled in the art will know that the appropriate photoinitiator for each selected light source must be chosen and, if necessary, sensitised. It has been found that the depth of penetration of the radiation into the polymerised composition and the processing rate are directly related to the absorption coefficient and the concentration of the photoinitiator. In stereolithography it is preferred to use those photoinitiators which generate the highest number of resulting free radicals and make possible the greatest depth of penetration into the compositions to be polymerised.

Accordingly, the invention also relates to a process for polymerising the novel compositions by irradiating said compositions with actinic light.

The novel compositions are liquids having a viscosity of c. 150 to c. 10,000 mPa.s at 30° C., preferably of 300 to 10,000 mPa.s, more particularly of 500 to 5000 mPa.s and, most preferably, of 500 to 2500 mPa.s. Surprisingly, the novel compositions have a low curl factor coupled with high light sensitivity and a high dimensional stability after precuring with laser light (green strength)—an important factor in stereolithography. After full cure, the shaped objects formed from the novel compositions have high mechanical strength coupled with adequate elasticity. They are therefore rigid-elastic and have excellent tear growth resistance.

The invention further relates to a process for the production of three-dimensional objects from the novel liquid compositions by lithographic methods, especially by stereolithography, in which a layer of novel liquid composition is irradiated over the entire surface or in a predetermined pattern with a UV/VIS light source, such that within the irradiated areas a layer solidifies in a desired layer thickness, then a new layer of novel composition is formed on the solidified layer, which is likewise irradiated over the entire surface or in a predetermined pattern, and such that three-dimensional objects are formed from a plurality of solidified layers which adhere to one another by repeated coating and irradiation.

In this process it is preferred to use a laser light which is preferably computer-controlled.

If the novel compositions are used as coating compositions, clear and hard coats are obtained on wood, paper, metal, ceramic or other surfaces. The coating thickness can vary over a very wide range and be from c. 1 gm to c. 1 mm. Relief images for printed circuit boards or printing plates can be produced from the novel compositions, conveniently by computer-controlled laser light of appropriate wavelength or using a photomask and a suitable light source.

It is preferred to use the novel compositions for the production of photopolymerised layers, especially in the form of three-dimensional objects which are formed from a plurality of solidified layers which adhere to one another.

The following urethane acrylates and hydroxyl group containing bis(meth)acrylates are used in the Examples:

Uvithane®892: Urethane acrylate supplied by Morton Thiokol Inc., double bond equivalent=1800, viscosity= 410 Pa.s at 49° C.

Sartomer®9504: A clear liquid urethane diacrylate supplied by Sartomer Company, Mw=1700, viscosity 167 cps at 25° C.

Diacrylate I: Reaction product of a diglycidyl ether of bisphenol A and acrylic acid, commercially available under the registered trademark Novacure®3700.

Diacrylate II: Reaction product of butanediol diglycidyl ether and acrylic acid, commercially available under the registered trademark Laromer®LR 8765.

Diacrylate III: Reaction product of the diglycidyl ester of hexahydrophthalic acid and methacrylic acid having a double bond value of 4.06 equivalents/kg, obtained by reacting 100 g of the diglycidyl ester of hexahydrophthalic acid having an epoxy value of 4.06 equivalents/kg with 66.2 g (0.77 mol) of methacrylic acid and 1% by weight of tetraammonium bromide as catalyst in toluene as solvent.

Diacrylate IV: Reaction product of sorbitol diglycidyl ether and acrylic acid having a double bond value of 3.3 equivalents/kg, obtained by reacting 100 g of sorbitol diglycidyl ether having an epoxy value of 4.90 equivalents/kg with 38.84 g (0.54 mol) of acrylic acid by the method disclosed in JP Kokai 63-132 916.

Diacrylate V: Reaction product of polypropylene glycol diglycidyl ether and acrylic acid having a double bond value of 2.27 equivalents/kg, obtained by reacting 100 g of polypropylene glycol diglycidyl ether having an epoxy value of 2.71 equivalents/kg with 21.4 g (0.3 mol) of acrylic acid by the process disclosed in JP Kokai 63-132 916.

Diacrylate VI: Reaction product of bis(3,4-epoxycyclohexylmethyl)adipate and acrylic acid having a double bond value of 3.18 equivalents/kg, obtained by reacting 100 g of bis-( 3,4-epoxycyclohexylmethyl)adipate having an epoxy value of 5.0 equivalents/kg with 39.6 g (0.55 mol) of acrylic acid by the process disclosed in JP Kokai 63-132 916.

Diacrylate VII: Reaction product of the diglycidyl ester of hexahydrophthalic acid and acrylic acid having a double bond value of 4.06 equivalents/kg, obtained by reacting 100 g of the diglycidyl ester of hexahydrophthalic acid having an epoxy value of 7.0 equivalents/kg with 55.4 g (0.77 mol) of acrylic acid and 1% by weight of tetraethylammonium bromide as catalyst.

Diacrylate VIII: Reaction product of sorbitol diglycidyl ether and methacrylic acid having a double bond value of 2.9 equivalents/kg, obtained by reacting 100 g of sorbitol diglycidyl ether having an epoxy value of 4.90 equivalents/kg with 46.4 g (0.54 mol) of methacrylic acid and 1% by weight of tetraethylammonium bromide as catalyst.

EXAMPLE 1

60 g of urethane acrylate SR 9504 are mixed with 20 g of N-vinylpyrrolidone, 5 g of 1-hydroxycyclohexyl phenyl ketone and 15 g of hexahydrophthalic acid diglycidyl ester dimethacrylate at 40° C. The resultant homogenous liquid composition has a viscosity of 1390 mPa.s at 35° C. A shaped object produced from this composition using a He-Cd laser (40 mJ/cm$^2$) has a modulus of elasticity (DIN 53 371; green strength) of 3 N/mm$^2$, a tensile strength σ max (DIN 53455) of 1 N/mm$^2$ and an elongation at break ε (DIN 35 455) of 32%.

After curing the green object for 30 minutes with UV/VIS light, the modulus of elasticity is 479 N/mm$^2$, the tensile strength 28 N/mm$^2$ and the elongation at break 37%. To measure the Shore hardness and the tear growth resistance, 2 mm sheets are cast from the liquid composition and cured for 60 minutes with UV/VIS light. The cured composition has a Shore D hardness of 72 and a tear growth resistance of 3.1 N/mm$^2$ (DIN 53 356A).

EXAMPLES 2–7

Formulations of the components listed in Tables 1 and 2 are prepared as in Example 1 and processed to three-dimensional shaped objects and to sheets under the conditions described in Example 1. The properties of the shaped objects are also shown in Tables 1 and 2.

TABLE 1

|  | Example | | |
| --- | --- | --- | --- |
|  | 2 | 3 | 4 |
| Uvithane 892 [g] | 53.95 | 59.425 | 60.0 |
| N-vinylpyrrolidone [g] | 17.575 | 24.265 | 20.0 |
| diacrylate I [g] | 6.350 | | |
| diacrylate II [g] | 17.123 | 11.309 | |
| diacrylate III [g] | | | 15.0 |
| 1-hydroxycyclohexyl phenyl ketone [g] | 5.0 | 5.0 | 5.0 |
| η (35° C.) [mPa · s] | 2990 | 1970 | 2940 |
| *modulus of elasticity [N/mm$^2$] | 12 | 2.4 | 1.4 |
| *σ$_{max}$ [N/mm$^2$] | 3.3 | 1 | 1.2 |
| *ε [%] | 44 | 41 | 68 |
| **modulus of elasticity [N/mm$^2$] | 60 | 25 | 136 |
| **σ$_{max}$ [N/mm$^2$] | 14 | 15 | 27 |
| **ε [%] | 64 | 96 | 90 |
| **tear growth resistance [N/mm] | 5 | 8 | 10.0 |
| **Shore D-hardness | 55 | 47 | 53 |

*values after laser cure (40 mJ/cm$^2$)
**values after full cure

TABLE 2

|  | Example | | |
| --- | --- | --- | --- |
|  | 5 | 6 | 7 |
| SR 9504 [g] | 60 | 60 | 60 |
| N-vinylpyrrolidone [g] | 20 | 20 | 20 |
| 1-hydroxycyclohexyl phenyl ketone [g] | 5 | 5 | 5 |
| diacrylate V [g] | 15 | | |
| diacrylate III [g] | | 15 | |
| diacrylate VI [g] | | | 15 |
| η (35° C.) [mPa · s] | 1220 | 1550 | 1670 |
| *modulus of elasticity [N/mm$^2$] | 9 | 72 | 72 |
| *σ$_{max}$ [N/mm$^2$] | 2 | 6 | 7 |
| *ε [%] | 22 | 29 | 31 |
| **modulus of elasticity [N/mm$^2$] | 118 | 458 | 425 |
| **σ$_{max}$ [N/mm$^2$] | 14 | 29 | 26 |
| **ε [%] | 39 | 36 | 38 |
| tear growth resistance (DIN 53356A) [N/mm] | 1.7 | 4.2 | 3.1 |
| Shore D-hardness | 47 | 68 | 69 |

*values after laser cure (40 mJ/cm$^2$)
**values after full cure

EXAMPLES 8 AND 9

Formulations of the components listed in Table 3 are prepared as in Example 1 and processed to three-dimensional shaped objects and to sheets under the conditions described in Example 1. The properties of the shaped objects are also shown in Table 3.

TABLE 3

| | Example | |
|---|---|---|
| | 8 | 9 |
| Uvithane 892 | 60 | 60 |
| N-vinylpyrrolidone | 20 | 20 |
| diacrylate VII | 15 | |
| diacrylate VIII | | 15 |
| 1-hydroxycyclohexyl phenyl ketone | 5 | 5 |
| $\eta$ (35° C.) [mPas] | 4990 | 5110 |
| *modulus of elasticity [N/mm$^2$] | 14.9 | 12.3 |
| *$\sigma_{max}$ [N/mm$^2$] | 2.7 | 4.8 |
| *$\epsilon$ [%] | 39.6 | 60.2 |
| **modulus of elasticity [N/mm$^2$] | 70.4 | 124.8 |
| **$\sigma_{max}$ [N/mm$^2$] | 10.9 | 12.5 |
| **$\epsilon$ [%] | 43.5 | 41.8 |
| tear growth resistance [N/mm] | 9.8 | 10.6 |
| Shore D-hardness | | |

*values after laser cure (40 mJ/cm$^2$)
**values after full cure

What is claimed is:

1. A liquid photosensitive composition consisting of
   (1) 40 to 80% by weight of a urethane (meth)acrylate having a functionality of 2 to 4 and a molecular weight (Mw) of 500 to 10,000 which is the reaction product of a hydroxyl-terminated polyurethane with acrylic acid or methacrylic acid or the reaction product of an isocyanate-terminated prepolymer with hydroxyalkyl acrylates or methacrylates,
   (2) 5 to 40% by weight of a hydroxyl group containing aliphatic or cycloaliphatic di(meth)acrylate which is the reaction product of an aliphatic or cycloaliphatic epoxy resin with (meth)acrylic acid,
   (3) 0 to 40% by weight of a mono(meth)acrylate or of a mono-N-vinyl compound having a Mw of not more than 500,
   (4) 0.1 to 10% by weight of a photoinitiator, and 0 to 5% by weight of further additives, such that the proportion of components (1) to (4) and any further additives together is 100% by weight and wherein components (1) and (2) are chemically different.

2. A composition according to claim 1, consisting of
   (1) 40 to 80% by weight of a urethane (meth)acrylate having a functionality of 2 to 4 and a molecular weight (Mw) of 500 to 10,000,
   (2) 5 to 40% by weight of a hydroxyl group containing aliphatic or cycloaliphatic di(meth)acrylate,
   (3) 5 to 40% by weight of a mono(meth)acrylate or of a mono-N-vinyl compound having a Mw of not more than 500,
   (4) 0.1 to 10% by weight of a photoinitiator, and 0 to 5% by weight of further additives.

3. A composition according to claim 1, wherein component (1) is an aliphatic urethane acrylate.

4. A composition according to claim 1, wherein the hydroxyl group containing diacrylate (2) is a reaction product of a diglycidyl ether of 1,4-butanediol and acrylic acid.

5. A composition according to claim 1, wherein component (2) is a hydroxyl group containing cycloaliphatic di(meth)acrylate.

6. A composition according to claim 5, wherein component (2) is a reaction product of the diglycidyl ester of hexahydrophthalic acid or bis(3,4-epoxycyclohexylmethyl)adipate and (meth)acrylic acid.

7. A composition according to claim 1, wherein component (3) is a mono-N-vinyl compound.

8. A composition according to claim 7, wherein component (3) is N-vinylpyrrolidone.

9. A composition according to claim 1, wherein the photoinitiator (4) is a 1-hydroxyphenyl ketone.

10. A composition according to claim 1, wherein the photoinitiator (4) is a 1-hydroxycyclohexyl phenyl ketone.

11. A process for polymerising a composition as claimed in claim 1 by irradiation with actinic light.

12. A three-dimensional object which is formed from a plurality of solidified layers which adhere to one another and which layers are obtained by the photopolymerization of a composition as claimed in claim 1.

13. A liquid photosensitive composition according to claim 1, wherein the proportion of component (1) is about 60 to 80% by weight of the entire composition.

14. A process for the production of three-dimensional objects from the liquid photosensitive composition of claim 1 by lithographic methods, wherein a layer of said liquid photosensitive composition is irradiated over the entire surface or in a predetermined pattern with a UV/VIS light source, such that within the irradiated areas a layer solidifies in a desired layer thickness, then a new layer of said composition is formed on the solidified layer, which is likewise irradiated over the entire surface or in a predetermined pattern, and such that three-dimensional objects are formed from a plurality of solidified layers which adhere to one an other by repeated coating and irradiation.

15. A process according to claim 14, wherein a laser beam, preferably a computer-controlled laser beam, is used as source of irradiation.

* * * * *